(12) United States Patent
Ikedo et al.

(10) Patent No.: US 8,000,365 B2
(45) Date of Patent: Aug. 16, 2011

(54) SEMICONDUCTOR LASER DEVICE

(75) Inventors: Norio Ikedo, Osaka (JP); Masao Kawaguchi, Osaka (JP); Masaaki Yuri, Osaka (JP)

(73) Assignee: Panasonic Corporation, Osaka (JP)

( * ) Notice: Subject to any disclaimer, the term of this patent is extended or adjusted under 35 U.S.C. 154(b) by 161 days.

(21) Appl. No.: 12/501,778

(22) Filed: Jul. 13, 2009

(65) Prior Publication Data

US 2010/0027575 A1 Feb. 4, 2010

(30) Foreign Application Priority Data

Jul. 29, 2008 (JP) .................................. 2008-195061

(51) Int. Cl.
*H01S 5/00* (2006.01)

(52) U.S. Cl. ............... 372/44.01; 372/43.01; 372/45.01; 372/46.01

(58) Field of Classification Search ............... 372/43.01, 372/44.01, 45.01
See application file for complete search history.

(56) References Cited

U.S. PATENT DOCUMENTS

| 5,585,957 | A | 12/1996 | Nakao et al. |
| 6,522,676 | B1 | 2/2003 | Goto et al. |
| 2003/0086459 | A1 | 5/2003 | Momose |
| 2008/0285611 | A1 | 11/2008 | Fujimoto |
| 2010/0074290 | A1* | 3/2010 | Kawaguchi et al. ....... 372/45.01 |

FOREIGN PATENT DOCUMENTS

| JP | 2000-286504 A | 10/2000 |
| JP | 2003-198057 | 7/2003 |

* cited by examiner

*Primary Examiner* — Dung Nguyen

(74) *Attorney, Agent, or Firm* — McDermott Will & Emery LLP

(57) ABSTRACT

A semiconductor laser device includes a multilayer structure made of group III nitride semiconductors formed on a substrate. The multilayer structure includes a MQW active layer, and also includes a step region selectively formed in an upper portion thereof. In another upper portion of the multilayer structure, a ridge stripe portion including a waveguide, which extends in parallel to a principal surface of the multilayer structure, is formed. In the vicinity of the step region, a first region, in which the MQW active layer has a bandgap energy of Eg1, is formed, and a second region, which is adjacent to the first region and in which the MQW active layer has a bandgap energy of Eg2 (Eg2<Eg1), is formed. The waveguide, which is formed so as to include the first and second regions and so as not to include the step region, performs self-oscillation.

6 Claims, 11 Drawing Sheets

SEMICONDUCTOR LASER DEVICE

CROSS REFERENCE TO RELATED APPLICATION

The disclosure of Japanese Patent Application No. 2008-195061 filed on Jul. 29, 2008 including specification, drawings and claims is incorporated herein by reference in its entirety.

BACKGROUND OF THE INVENTION

The present invention relates to semiconductor laser devices, and particularly relates to blue-violet semiconductor laser devices that perform self-oscillation.

Semiconductor laser devices, whose current-optical output power characteristics exhibit excellent linearity and which emit highly monochromatic intense light, can focus laser light to a small spot.

Thus, semiconductor laser devices are used as light sources in optical pickups that drive equipment for recording media, such as optical discs and magneto-optical discs, that are written and reproduced by application of light. In recent years, semiconductor laser devices have started being used in drives for high-density recording media, such as blue DVDs (Digital Versatile Discs). In particular, devices as light sources using group III nitride semiconductor laser devices are being developed.

When laser light emitted from a semiconductor laser device is reflected off the optical disc, and re-enters the facet of the semiconductor laser device as return light, the return light causes noise. To reduce such return light noise, a method is adopted in which when a signal is reproduced, a high-frequency current is superimposed on the semiconductor laser device so as to make the oscillation spectrum be multimodal, thereby reducing the coherence of the laser light, and thus, reducing return light noise.

As a method for reducing return light noise, there is a known method in which a region (called a saturable absorption region) having light absorption effect is formed around a light amplification region and a gain region (called an absorption region) in an active layer so as to perform self-oscillation. During self-oscillation, the effective refractive index in the waveguide changes to cause the oscillation wavelength to fluctuate, thereby reducing the coherence of light, and thus, reducing return light noise.

For example, Japanese Laid-Open Publication No. 2000-286504 (hereinafter referred to as "Patent Document") describes a nitride semiconductor self-oscillation laser device that includes a light amplification region and a saturable absorption region serving as a light absorption region.

FIG. 12 illustrates a cross-sectional structure of the nitride semiconductor laser device described in Patent Document. As shown in FIG. 12, the conventional nitride semiconductor laser device includes an n-type contact layer 102, an n-type clad layer 103, an active layer 104, a p-type clad layer 105, an n-type current confinement structure 106, and a p-type contact layer 108 sequentially stacked on the principal surface of a substrate 101 made of sapphire.

The p-type clad layer 105 includes a flat portion 105a, a lower stripe portion 105b, and an upper stripe portion 105c. The flat portion 105a is formed so as to cover the top surface of the active layer 104. The lower stripe portion 105b having a width of W2 is formed so as to protrude upwardly from the central part of the flat portion 105a. The upper stripe portion 105c having a width of W1 is formed so as to further protrude from the central part of the lower stripe portion 105b. That is, the lower stripe portion 105b and the upper stripe portion 105c are formed in such a manner that the width W1 is smaller than the width W2.

An n-side electrode 109 is formed on the exposed part of the n-type contact layer 102, and a terminal 110 is formed on the p-type contact layer 108.

The nitride semiconductor laser device thus structured is regulated by the width W1 of the upper stripe portion 105c, and a current flowing from the p-type clad layer 105 to the active layer 104 is controlled so as not to expand laterally. Consequently, a current injection region of a size corresponding to the width W1 of the upper stripe portion 105c is formed in the central part of the active layer 104. Also, since the width W2 of the lower stripe portion 105b is greater than the width W1 of the upper stripe portion 105c, the emission spot has a width corresponding to the width W2 of the lower stripe portion 105b, and a saturable absorption region is formed around the current injection region. As a result, in the active layer 104, the current injection region and the saturable absorption region interact with each other, thereby performing self-oscillation, and thus achieving a pulsed optical output.

In this self-oscillation semiconductor laser device, the intra-active-layer optical gain region (having a width of G) occurring due to expansion of current is narrowed as much as possible, while the spot size (having a width of S) of the waveguide is set to a relatively large size. When the relationship S>G is satisfied, the difference therebetween functions as a saturable absorber, causing self-oscillation to occur.

Thus, the waveguide satisfies the above relationship as an intermediate waveguide between an index-guide laser device and a gain-guide laser device. Producing sufficient saturable absorption effect is important to maintain stable self-oscillation. The effect of the saturable absorber is effectively increased when the differential gain ($\partial G/\partial n$ where G represents the optical gain, and n represents the injected carrier concentration) of the emission optical gain region in the central part of the active layer 104 (i.e., saturation at the time of laser oscillation) is low, and the differential gain of the saturable absorber is high, that is, when the difference therebetween is large. Thus, the differential gains and the magnitudes thereof are important as self-oscillation conditions. For the active layer 104, a multiple quantum well (MQW) structure is often employed.

In order to achieve stable occurrence of self-oscillation, the following two items need to be satisfied.

(1) A difference between the differential gain in the emission region in the active layer and that in the saturable absorption region should be high, and the differential gain in the emission region should be easily saturated.

(2) The light absorption effect in the saturable absorption region should be considerable.

FIG. 13 shows the relationship between a typical optical gain G and an injected carrier concentration n. To achieve stable occurrence of self-oscillation, the conditions in the above-described items (1) and (2) need to be satisfied. However, in a case in which the differential gain in the emission region is not likely to become saturated, it is difficult for self-oscillation to occur stably.

FIG. 14 qualitatively shows the relationship between the number N of quantum wells in a MQW structure and an injected carrier concentration related to the optical gain. As the number N of quantum wells is increased, it becomes difficult for the optical gain to become saturated, and thus, self-oscillation is difficult to achieve.

That is, the smaller the number N of quantum wells is, the more easily the gain G of the emission region becomes saturated. Hence, as compared with an active layer having a MQW structure in which the optical gain is hardly saturated, the optical gain is easily saturated as in a bulk active layer. Therefore, increasing the effect of saturation leads to the reliable self-oscillation.

SUMMARY OF THE INVENTION

However, in the conventional self-oscillation semiconductor laser device, the light absorption coefficient is high when a bulk structure is employed, and the light absorption coefficient is low when a quantum well structure is employed. This has been also demonstrated by the fact that when quantum well structures are employed in waveguides, excellent waveguide characteristics are achieved with less waveguide loss. However, low light absorption is contrary to the condition "the light absorption effect in the saturable absorption region should be considerable" described in item (2). Thus, it is difficult to realize stable self-oscillation.

On the other hand, in order to increase the amount of light absorption, it is effective to employ a bulk structure or to reduce the number of wells in the multiple quantum well structure. In that case, however, it is not possible to satisfy the condition "a difference between the differential gain in the emission region in the active layer and that in the saturable absorption region should be high, and the differential gain in the emission region should be easily saturated" described in item (1).

Therefore, at present, self-oscillation semiconductor laser devices that satisfy both conditions described in items (1) and (2) have not yet been realized.

It is an object of the present invention to solve these problems with the conventional semiconductor laser device, and to realize semiconductor laser devices capable of stable self-oscillation.

In order to achieve the object, a semiconductor laser device according to the present invention is configured so as to include a step region in the vicinity of a waveguide in a multilayer structure that is made of group III nitride semiconductors and that includes a laser structure.

As a result of various studies, the present inventors have found that if gallium nitride (GaN)-based semiconductors including a laser structure are formed after a step region is formed in a part of a substrate, then an area in an active layer located in the vicinity of the step region has a different bandgap energy value from an area in the active layer located away from the step region. When one of these areas having lower bandgap energy is used as a saturable absorption region in the waveguide in the laser device, the following effects are produced. The amount of saturable absorption is increased, thereby increasing the differential gain in the saturable absorption region, while the optical gain in the emission region is reduced, resulting in a reduction in differential gain because part of the bandgap is different. Accordingly, the conditions described in items (1) and (2) are satisfied, thereby enabling stable self-oscillation.

The present invention has been made from these findings. Specifically, the present invention is realized by the following structure.

An inventive semiconductor laser device includes a substrate; and a multilayer structure made of group III nitride semiconductors formed on the substrate, the multilayer structure including an active layer. The multilayer structure includes a stripe-shaped waveguide extending in parallel to a principal surface of the multilayer structure, a step region selectively formed in an upper portion of the multilayer structure in the vicinity of the waveguide, a first region, which is formed in an area of the waveguide in the vicinity of the step region, and in which the active layer has a bandgap energy of Eg1, and a second region, which is formed in an area of the waveguide other than in the vicinity of the step region, and in which the active layer has a bandgap energy of Eg2 (Eg2≠Eg1). The first region and the second region are adjacent to each other. The waveguide is formed in a region that does not include the step region, so as to perform self-oscillation.

In the inventive semiconductor laser device, light absorption is increased in the region in the waveguide that has lower bandgap energy, either Eg1 or Eg2. Consequently, the region having lower bandgap strongly acts as a saturable absorption region, thereby realizing a group III nitride semiconductor laser device that performs stable self-oscillation.

In the inventive semiconductor laser device, a recess or a protrusion is preferably formed in or on a principal surface of the substrate; and the step region is preferably formed due to the recess in or the protrusion on the substrate.

Then, the off-angle dependence of bandgap energy can be utilized. That is, a recess or a protrusion formed in or on the principal surface of the substrate for the step region in the vicinity of the waveguide causes an off-angle, which is different from the plane orientation of the substrate's principal surface, to be formed when the part of the multilayer structure serving as the waveguide is formed in the vicinity of the step region. This off-angle causes the bandgap energy in the part of the active layer in the vicinity of the step region to change.

In the inventive semiconductor laser device, the active layer preferably contains indium (In).

Then, the In content in the active layer changes depending on the substrate off-angle, thereby reliably changing the bandgap energy in the active layer.

In the inventive semiconductor laser device, an inclination angle at which the first region is inclined with respect to a crystal plane of the principal surface of the multilayer structure is preferably different from an inclination angle at which the second region is inclined with respect to the crystal plane of the principal surface.

Then, the first and second regions, which have different inclination angles, have different off-angles because the bandgap energy determined by the proportion of the mixed crystal of group III nitride semiconductor crystals changes due to the off-angle dependence thereof. This reliably produces a difference between the bandgap energy of the first region and that of the second region.

In the inventive semiconductor laser device, a principal surface of the substrate preferably has a {0001} crystal plane orientation; the waveguide is preferably formed in a <1-100> direction of a crystal axis; and at least a part of the step region is preferably formed along the waveguide.

Typically, a reflecting mirror in a semiconductor laser device is formed using a cleaved crystal plane. Therefore, if the direction in which the waveguide extends and the direction in which at least a part of the step region extends are set to the <1-100> direction with respect to the {0001} plane that is the plane orientation of the substrate's principal surface, then it becomes possible to form a reflecting mirror through a simple cleavage process. In this specification, for convenience sake, the minus sign "−" provided to the index numbers of plane orientations and crystal axes indicates inversion of the one index number following the minus sign.

In the inventive semiconductor laser device, the length of the step region in the <1-100> direction of the crystal axis is preferably set in such a manner that one of the first and second regions having higher bandgap energy has a greater length than the other having lower bandgap energy in the direction in which the waveguide extends.

Then, of the first and second regions having different bandgap energy, the region having higher bandgap energy mainly works for the optical gain during laser oscillation, while the region having lower bandgap energy effectively acts as a saturable absorption region, thereby achieving stable self-oscillation.

As described above, the semiconductor laser devices according to the present invention realize group III nitride semiconductor laser devices that perform stable self-oscillation.

BRIEF DESCRIPTION OF THE DRAWINGS

FIG. 1A is a plan view, FIG. 1B is a cross-sectional view taken along the line Ib-Ib of FIG. 1A, and FIG. 1C is a cross-sectional view taken along the line Ic-Ic of FIG. 1A.

FIG. 9A is a plan view, FIG. 9B is a cross-sectional view taken along the line IXb-IXb of FIG. 9A, and FIG. 9C is a cross-sectional view taken along the line IXc-IXc of FIG. 9A.

FIG. 10A is a plan view, FIG. 10B is a cross-sectional view taken along the line Xb-Xb of FIG. 10A, and FIG. 10C shows a cross-sectional view taken along the line Xc-Xc of FIG. 10A.

FIG. 11A is a plan view, FIG. 11B is a cross-sectional view taken along the line XIb-XIb of FIG. 11A, and FIG. 11C is a cross-sectional view taken along the line XIc-XIc of FIG. 11A.

DETAILED DESCRIPTION OF THE INVENTION

Embodiment

Hereinafter, a semiconductor laser device according to an example embodiment will be described with reference to the accompanying drawings.

Figure 1A:
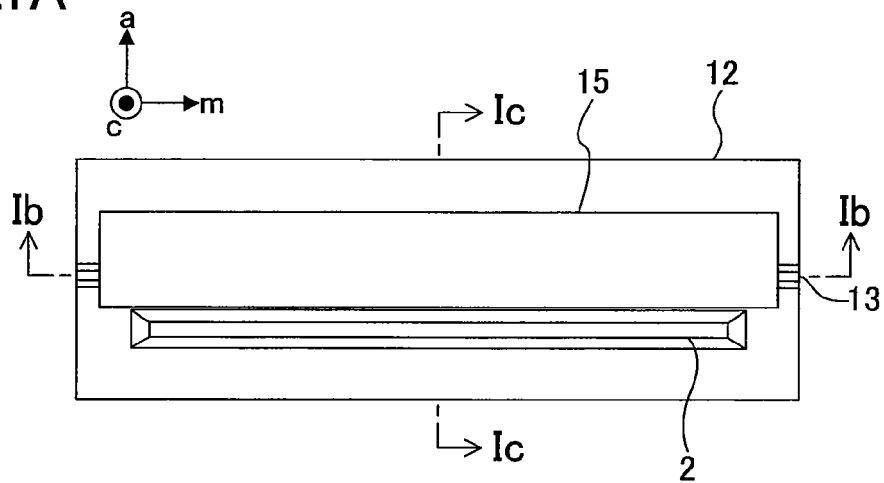
FIGS. 1A to 1C illustrate a blue-violet semiconductor laser device according to an example embodiment.
Figure 1B:
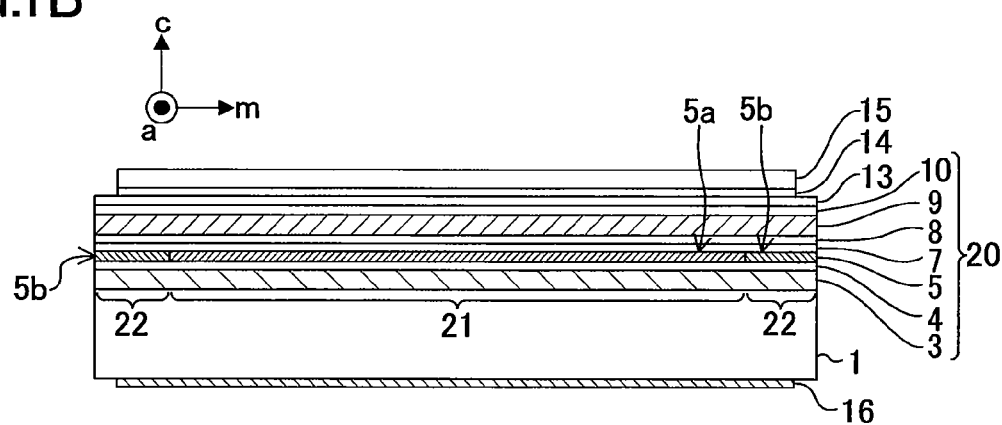
Figure 1C:
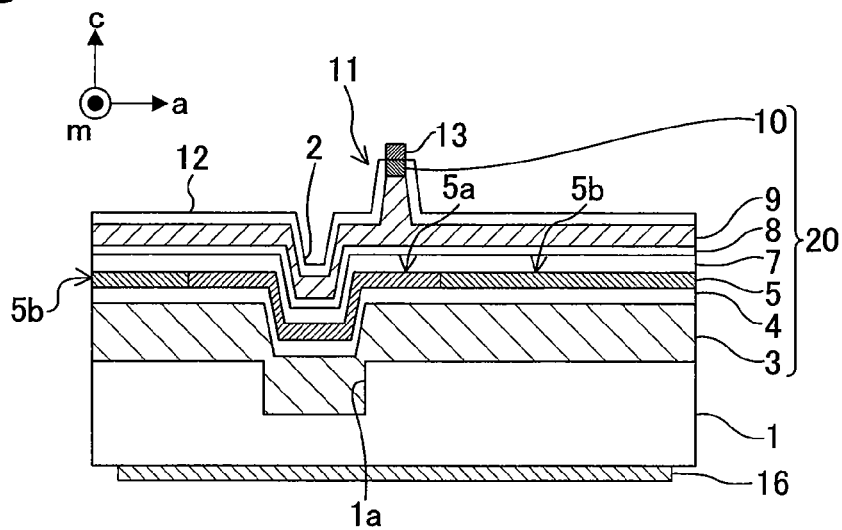

FIGS. 1A to 1C illustrate a blue-violet semiconductor laser device according to the example embodiment. FIG. 1A shows a planar structure, FIG. 1B shows a cross-sectional structure taken along the line Ib-Ib of FIG. 1A, and FIG. 1C shows a cross-sectional structure taken along the line Ic-Ic of FIG. 1A.

The semiconductor laser device according to this embodiment is a blue-violet semiconductor laser device made of gallium-nitride-based semiconductors and operating at an oscillation wavelength of 405 nm.

As shown in FIGS. 1A to 1C, the semiconductor laser device according to this embodiment includes a multilayer structure 20 on the (0001) oriented principal surface of a substrate 1 made of n-type gallium nitride (GaN). The multilayer structure 20 is composed of an n-type clad layer 3, an n-type optical guide layer 4, a multiple quantum well (MQW) active layer 5, a p-type optical guide layer 7, a carrier overflow suppression layer (OFS layer) 8, a p-type clad layer 9, and a p-type contact layer 10. The n-type clad layer 3 is made of n-type $Al_{0.05}Ga_{0.95}N$. The n-type optical guide layer 4 is made of n-type GaN. The MQW active layer 5 is formed by stacking five quantum well structures, each of which is composed of a barrier layer made of $In_{0.02}Ga_{0.98}N$ and a well layer made of $In_{0.06}Ga_{0.94}N$. The p-type optical guide layer 7 is made of p-type GaN. The OFS layer 8 is made of $Al_{0.20}Ga_{0.80}N$. The p-type clad layer 9 has a strained superlattice structure obtained by repeatedly stacking 160 p-type $Al_{0.10}Ga_{0.90}N$ layers and 160 p-type GaN layers in an alternating manner. The p-type contact layer 10 is made of p-type GaN. The substrate 1 is not limited to n-type GaN, but n-type aluminum gallium nitride (AlGaN) may also be used.

In FIGS. 1A to 1C, the crystal orientations of the substrate 1 and of the multilayer structure 20 are indicated by the characters c, a, and m. The character "c" indicates (0001) planes and the equivalent normal vector (the c-axis) of (0001) planes, "a" indicates (11-20) planes and the equivalent normal vector (the a-axis) thereof, and "m" indicates (1-100) planes and the equivalent normal vector (the m-axis) thereof.

As shown in FIG. 1C, in this embodiment, a groove 1a is formed in the principal surface of the substrate 1 along the direction of the m-axis. Due to this groove 1a, a recess 2 is also formed in the upper portion of the multilayer structure 20. The recess 2 reflects the cross-sectional shape of the groove 1a in the substrate 1, and thus forms a step region. In this semiconductor laser device, the groove 1a is formed spaced apart from each of the two cleaved facets that face in the m-axis direction.

In the multilayer structure 20, a ridge stripe portion 11 is formed along the recess 2. The ridge stripe portion 11 includes the p-type contact layer 10 as the upper portion thereof and a part of the p-type clad layer 9 as the lower portion thereof.

This embodiment is characterized in that bandgap energy Eg1 in a region in the MQW active layer 5 located in the vicinity of the recess 2 and bandgap energy Eg2 in a region in the MQW active layer 5 located away from the recess 2 satisfy the relationship Eg1>Eg2.

According to the present invention, as shown in FIGS. 1B and 1C, a first region 5a having high bandgap energy is formed in a waveguide. The first region 5a occurs because of the recess 2 (the step region) in the upper portion of the multilayer structure 20 formed due to the groove 1a in the substrate 1. A second region 5b having low bandgap energy is also formed in the single waveguide by not forming the step region resulting from the groove 1a in the facets of the multilayer structure 20 in the m-axis direction and in the vicinity of those facets. Consequently, the amount of saturable absorption of light increases in the low-bandgap-energy second region 5b in the waveguide, thereby enabling stable self-oscillation.

That is, as shown in FIG. 1B, the blue-violet semiconductor laser device according to this embodiment includes an optical gain region 21 and a saturable absorption region 22 in the direction (i.e., the cavity length direction) in which the ridge stripe portion 11 extends. The optical gain region 21 is formed of the first region 5a having high bandgap energy. The saturable absorption region 22 is formed of the second region 5b located on the sides of the first region 5a and having lower bandgap energy than the first region 5a.

The effects of the high-bandgap-energy first region 5a formed in the MQW active layer 5 due to the step region will be described later in detail.

In this embodiment, the groove 1a formed in the substrate 1 has a width of 30 µm in the direction of the a-axis, and has a length of 300 µm in the direction of the m-axis in planar dimensions. However, those dimensions are just examples, and the width of the groove 1a in the a-axis direction is preferably about 2 µm or more and about 200 µm or less, and even more preferably, about 2 µm or more and about 100 µm or less. The length of the groove 1a in the m-axis direction is preferably equal to or more than one half of the length (the cavity length) of the ridge stripe portion 11 but less than the cavity length. The cavity length is from about 300 µm to about 400 µm, for example, but is not limited to these values. The depth of the groove 1a, which is 2 µm in this embodiment, is preferably about 0.1 µm or more and about 5 µm or less.

On the top surface of the multilayer structure 20 having the ridge stripe portion 11, an insulating film 12 made of silicon dioxide ($SiO_2$) is formed except for the top surface of the ridge stripe portion 11.

A p-side electrode 13 made of palladium (Pd) and platinum (Pt) is formed on the p-type contact layer 10 exposed at the top surface of the ridge stripe portion 11.

As shown in FIGS. 1A and 1B, a wiring electrode 14 made of titanium (Ti), platinum (Pt), and gold (Au) is formed on the insulating film 12 so as to cover the ridge stripe portion 11. On the wiring electrode 14, a pad electrode 15 (not shown in FIG. 1C) made of gold (Au) is formed.

A method for fabricating the blue-violet semiconductor laser device thus structured will be described below.

First, a silicon dioxide ($SiO_2$) film is deposited to a thickness of 600 nm on the (0001) oriented principal surface of the substrate 1 made of n-type GaN by a thermal chemical vapor deposition process using a silane ($SiH_4$) gas as a material. Then, the deposited $SiO_2$ film is subjected to lithographic and etching processes so that openings are formed therein, thereby forming a first mask film (not shown) for forming the grooves 1a. Each of the openings has a rectangular planar shape that is in parallel with the a- and m-axes and that has a width of 30 µm in the a-axis direction and a length of 300 µm in the m-axis direction.

Next, the substrate 1 is etched through the first mask film by inductively coupled plasma (ICP) etching equipment using carbon tetrafluoride ($CF_4$) as an etching gas, thereby forming the grooves 1a having a depth of 2 µm in the substrate 1. Thereafter, the first mask film is removed using a hydrofluoric acid (HF).

Then, the multilayer structure 20 made of group III nitride semiconductors is epitaxially formed on the principal surface of the substrate 1, in which the grooves 1a have been formed, by metalorganic chemical vapor deposition (MOCVD). Specifically, the n-type clad layer 3 made of 1.5-µm-thick n-type $Al_{0.05}Ga_{0.95}N$ and the n-type optical guide layer 4 made of 0.1-µm-thick n-type GaN are sequentially formed on the entire principal surface of the substrate 1 as well as on the grooves 1a.

Subsequently, five quantum well structures, each of which is composed of a barrier layer made of 7.5-nm-thick $In_{0.02}Ga_{0.98}N$ and a well layer made of 3-nm-thick $In_{0.06}Ga_{0.94}N$, are stacked on the n-type optical guide layer 4, thereby forming the MQW active layer 5.

Next, the p-type optical guide layer 7 made of 0.1-µm-thick p-type GaN is formed on the MQW active layer 5. Subsequently, the carrier overflow suppression layer 8 made of $Al_{0.20}Ga_{0.80}N$ is formed. Then, 160 p-type $Al_{0.10}Ga_{0.90}N$ layers and 160 p-type GaN layers, each having a thickness of 1.5 nm, are repeatedly stacked in an alternating manner on the carrier overflow suppression layer 8, thereby forming the p-type clad layer 9 having a strained superlattice structure. Subsequently, the p-type contact layer 10 made of 0.05-µm-thick p-type GaN is formed on the p-type clad layer 9.

Examples of the materials used in this embodiment are as follows. For the group III material, trimethylgallium (TMG) is used as a Ga source, trimethylaluminum (TMA) is used as an Al source, and trimethylindium (TMI) is used as an In source. For the group V material, ammonia ($NH_3$) is used as a nitrogen (N) source. A mono-silane ($SiH_4$) gas, which is a Si source, is used as an n-type impurity material. Bis (cyclopentadienyl) magnesium ($Cp_2Mg$), which is a Mg source, is used as a p-type impurity material.

As shown in FIG. 1C, each recess 2 in the upper portion of the multilayer structure 20 including the MQW active layer 5 is formed so as to fill the groove 1a formed in the substrate 1. The recess 2 may be filled depending on the conditions under which the multilayer structure 20 is grown. However, as long as, due to the effect of the groove 1a formed in the substrate 1, the bandgap energy Eg1 in the first region 5a, which includes a part of the MQW active layer 5 located over the groove 1a and the area around that part, is higher than the bandgap energy Eg2 in the other part of the MQW active layer 5, the amount of light absorption is increased, thereby enabling stable self-oscillation.

Next, a silicon oxide film is deposited to a thickness of 0.3 µm on the p-type contact layer 10 by thermal CVD. Subsequently, second mask films (not shown) used to form the ridge stripe portions are formed out of the silicon oxide film by lithography and by etching. Each second mask film has a width of 1.5 µm and is in parallel with the m-axis direction. In this embodiment, the location on the p-type contact layer 10 where each second mask film is formed is just 5 µm away from the edge of a corresponding step region. Each ridge stripe portion formation location is 5 µm away from the edge of a corresponding step region in this embodiment, but may be located at any distance away from the edge of the step region so long as the relationship Eg1≠Eg2 is satisfied. Nevertheless, as will be discussed later, the ridge stripe portion formation location is preferably away from the edge of the step region by a distance of 1 μm or more and 15 μm or less, and even more preferably, by a distance of 2 μm or more and 10 μm or less.

Then, with the second mask films being used, the upper portion of the multilayer structure 20 is etched to a depth of 0.35 μm by an 1CP process, thereby forming the ridge stripe portions 11, in which the p-type clad layer 9 is exposed. Thereafter, the second mask films are removed using a hydrofluoric acid. Subsequently, the insulating film 12 made of 200-nm-thick $SiO_2$ is formed on the entire exposed part of the p-type clad layer 9 as well as on the ridge stripe portions 11 by thermal CVD.

Next, a resist pattern (not shown), which has 1.3-μm-wide openings extending along the ridge stripe portions 11 and exposing the top surfaces of parts of the insulating film 12 located on the ridge stripe portions 11, is formed by lithography. Thereafter, with the resist pattern used as a mask, the insulating film 12 is etched by reactive ion etching (RIE) using a trifluoromethane ($CHF_3$) gas, thereby exposing the p-type contact layer 10 through each opening in the insulating film 12 located on each ridge stripe portion 11.

Subsequently, a multilayer metal film, which is composed of 40-nm-thick palladium (Pd) and 35-nm-thick platinum (Pt), is formed at least on the p-type contact layers 10 exposed at the top surfaces of the ridge stripe portions 11, using a vacuum evaporation method. Thereafter, a lift-off process is performed to remove the resist pattern, thereby forming the p-side electrodes 13 out of the multilayer metal film.

Next, as shown in FIG. 1B, the wiring electrodes 14 having a width of 150 μm are selectively formed on the insulating film 12 by lithography and by liftoff so as to extend in the direction parallel to the ridge stripe portions 11, and so as to cover the p-side electrodes 13 on the ridge stripe portions 11. The wiring electrodes 14 are formed of a multilayer metal film made of 50-nm-thick Ti, 200-nm-thick Pt, and 100-nm-thick Au.

Then, the thickness of the Au layers in the wiring electrodes 14 is increased to about 10 μm by electrolytic plating, thereby forming the pad electrodes 15 made of Au. In this process step, the pad electrodes 15 are formed in such a manner that a separate pad electrode 15 is provided in each chip. This is because if the pad electrodes 15 are formed across adjacent laser structures, the electrodes will peel off when those adjacent laser structures are separated into chips.

Next, the substrate 1 as a wafer with the layers and electrodes up to the pad electrodes 15 formed thereover is polished from the backside thereof until the thickness of the substrate 1 is reduced to about 100 μm. Thereafter, a multilayer metal film, which is made of 5-nm-thick Ti, 10-nm-thick Pt, and 1000-nm-thick Au, is deposited on the backside of the substrate 1 by vacuum evaporation, thereby forming the n-side electrodes 16.

Subsequently, the substrate 1 as a wafer is subjected to primary cleavage along the m plane (the a-axis) so as to have a length of 400 μm in the m-axis direction. The first cleavage is performed so as not to cleave the first regions 5a, which are the parts of the MQW active layer 5 in which the bandgap energy is increased by the grooves 1a formed in the substrate 1. After the first cleavage, the substrate 1 undergoes secondary cleavage along the a plane (the m-axis) so as to have a dimension (width) of 200 μm in the a-axis direction, thereby separating the substrate 1 into laser chips.

Now, a description will be made of the phenomenon in which the step region formed due to the groove 1a in the substrate 1 causes the bandgap energy in the MQW active layer 5 to change.

Figure 2A:
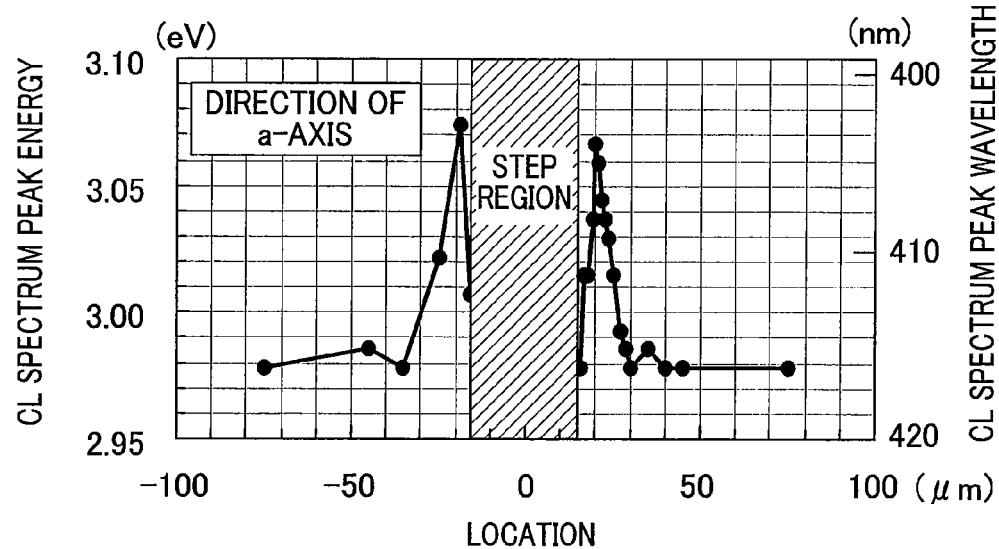
FIG. 2A is a graph showing the location dependence of the peak energy (wavelength) of a CL spectrum in the direction of a-axis, with the origin point being the center of a step region.
Figure 2B:
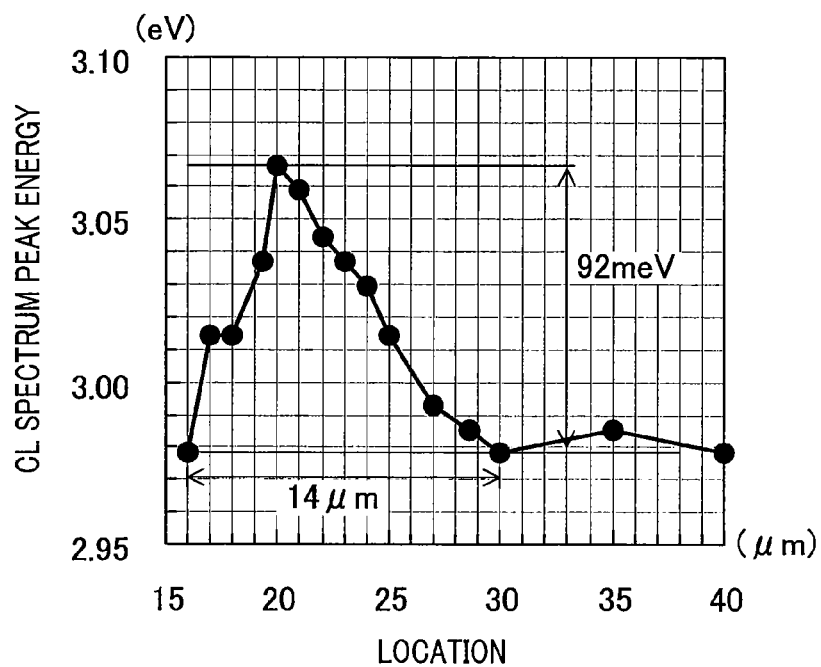
FIG. 2B is a magnified view of a part of the graph of FIG. 2A located in the vicinity of the step region (on the positive side).

In FIG. 2A, the left-hand ordinate indicates peak energy of a cathode luminescence (CL) spectrum measured in the a-axis direction, with the origin point being the widthwise center line of the step region (i.e., the groove 1a in the substrate 1 in this embodiment). FIG. 2B is a magnified view of a part of the CL spectrum peak energy of FIG. 2A located in the vicinity of the step region. In FIG. 2A, the origin point is the center of the step region in which the shorter sides are 30 μm and the longer sides are 300 μm. In FIGS. 2A and 2B, the position in the abscissa represented by 15 μm is the edge of the step region.

Figure 3A:
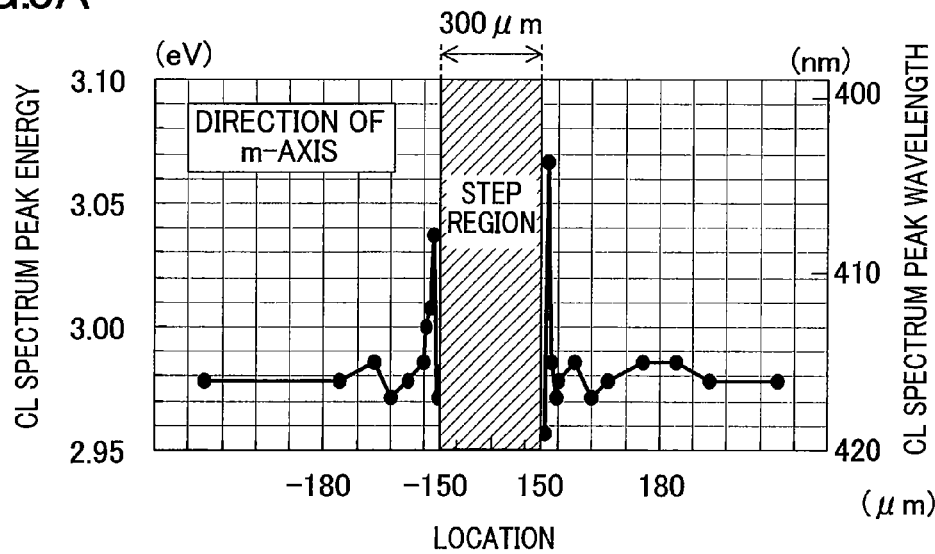
FIG. 3A is a graph showing the location dependence of the peak energy (wavelength) of a CL spectrum in the direction of m-axis, with the origin point being the center of the step region.
Figure 3B:
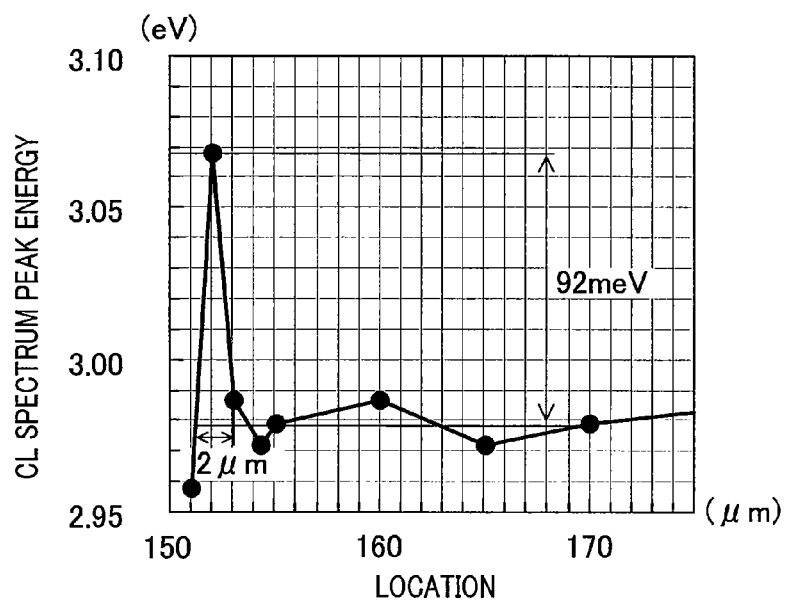
FIG. 3B is a magnified view of a part of the graph of FIG. 3A located in the vicinity of the step region (on the positive side).

In FIG. 3A, the left-hand ordinate indicates peak energy of a CL spectrum measured in the m-axis direction, with the origin point being the lengthwise center line of the step region. FIG. 3B is a magnified view of a part of the CL spectrum peak energy of FIG. 3A located in the vicinity of the step region.

In FIGS. 2A, 2B, 3A, and 3B, the right-hand ordinate indicates the wavelength corresponding to the peak energy of the CL spectrum indicated by the left-hand ordinate. As can be seen from FIGS. 2 and 3, in the vicinity of the step region, there are areas where the peak energy of the CL spectrum increases. Typically, as the bandgap energy is increased, the value of peak energy is increased, that is, the light absorption wavelength is shorted.

As can be seen from FIGS. 2B and 3B, the maximum amount of change in the peak energy of the CL spectrum, which is about 92 meV, is substantially the same in the a-axis direction and in the m-axis direction, however, the areas where the peak energy of the CL spectrum changes have different widths. In the case of the a-axis direction shown in FIG. 2B, the width is about 14 μm, while in the case of the m-axis direction shown in FIG. 3B, the width is about 2 μm.

Therefore, the first region 5a, where the peak energy of the CL spectrum changes, is formed in a part of the waveguide located in the vicinity of the step region (the recess 2) in the MQW active layer 5 in such a manner as to include an area exceeding the half of the cavity length. Consequently, the optical gain region 21 having an optical gain is formed with the center thereof being located in the vicinity of the step region in the MQW active layer 5, while the saturable absorption region 22 is formed in the second region 5b that is located in the waveguide and that has no step region therein. The saturable absorption region 22 is easily adjustable by the length of the step region (the groove 1a) in the m-axis direction with respect to the cavity length.

The present inventors also examined the In content in the areas where the peak energy of the CL spectrum is high and the In content in the areas where the peak energy of the CL spectrum is low by electron probe micro-analysis (EPMA). From the analysis, it has been found that the In content is low in the areas where the peak energy of the CL spectrum is high, and the In content is high in the areas where the peak energy of the CL spectrum is low. Typically, in InGaN, the higher the In content is, the lower the peak energy of the CL spectrum is. Thus, presumably, the changes in the peak energy of the CL spectrum in the vicinity of the step region in the MQW active layer 5 occur due to changes in In content.

Figure 4:
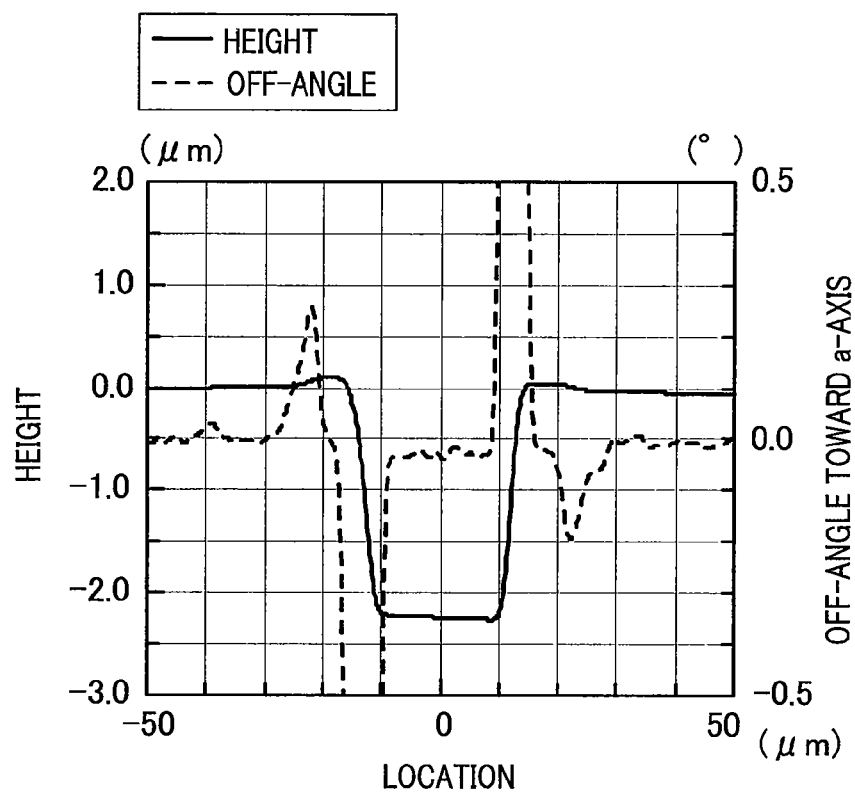
FIG. 4 is a graph showing the results of height measurement performed with a step-measuring device in the vicinity of the step region in the multilayer structure in the blue-violet semiconductor laser device according to the example embodiment, and also showing the off-angle estimated from the height.

Then, the present inventors evaluated the height of the CL spectrum evaluation regions shown in FIGS. 2A and 2B using a device for measuring a step or a level difference, and found that the areas where the peak energy of the CL spectrum had changed were slightly inclined. FIG. 4 shows the evaluation results.

In FIG. 4, the left-hand ordinate indicates the results of the evaluation of the height in the a-axis direction, and the right-hand ordinate indicates the inclination angle toward the a-axis direction known from changes in height.

It is known that, in an InGaN material formed on a c plane, as the off-angle is increased, the In content is lowered, and the emission peak energy is increased. Therefore, it is presumed that, in the vicinity of the step region, as the off-angle was increased, the In content was lowered, and the peak energy of the CL spectrum was increased.

The increase in the peak energy of the CL spectrum that causes the optical gain region 21 to be formed may result not only from an increase in off-angle occurring due to the step region, but also from a reduction in well width occurring due to a reduction in the amount of In and Ga incorporated into semiconductor layers in the vicinity of the step region during the crystal growth.

Figure 5:
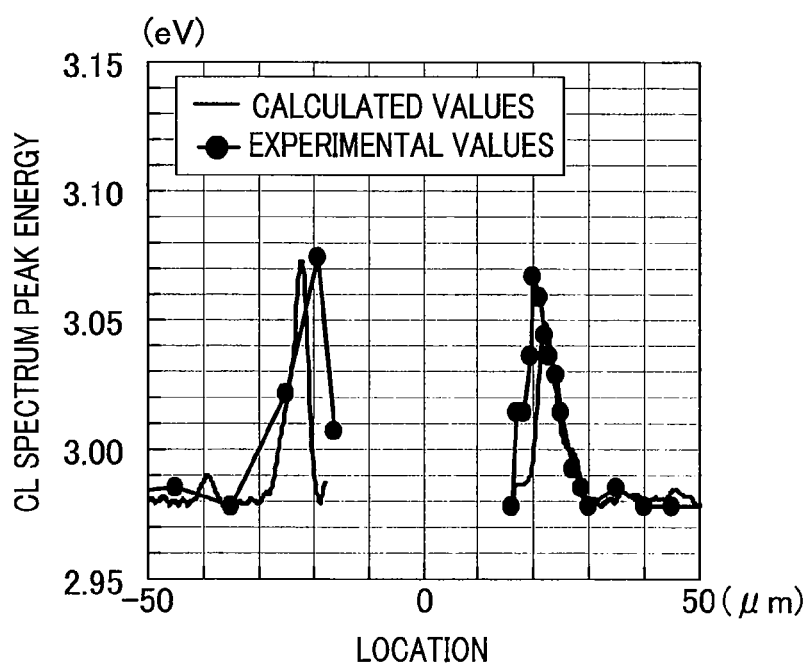
FIG. 5 is a graph showing calculated values of emission energy in an active layer, estimated from changes in off-angle shown in FIG. 4, and experimental values thereof.

FIG. 5 shows superimposition of the emission energy in the InGaN MQW active layer 5 calculated from the off-angle shown in FIG. 4 and the peak energy of the CL spectrum obtained by experiment. In FIG. 5, the locations of the energy change areas and the amount of energy change are approximately the same in the calculated values and in the experimental values. Thus, it is presumed that the increased off-angle in the vicinity of the step region in the multilayer structure 20 reduced the In content in the MQW active layer 5, resulting in the increased peak energy of the CL spectrum.

The laser characteristics of the blue-violet semiconductor laser device according to this embodiment will be described below.

Figure 6:
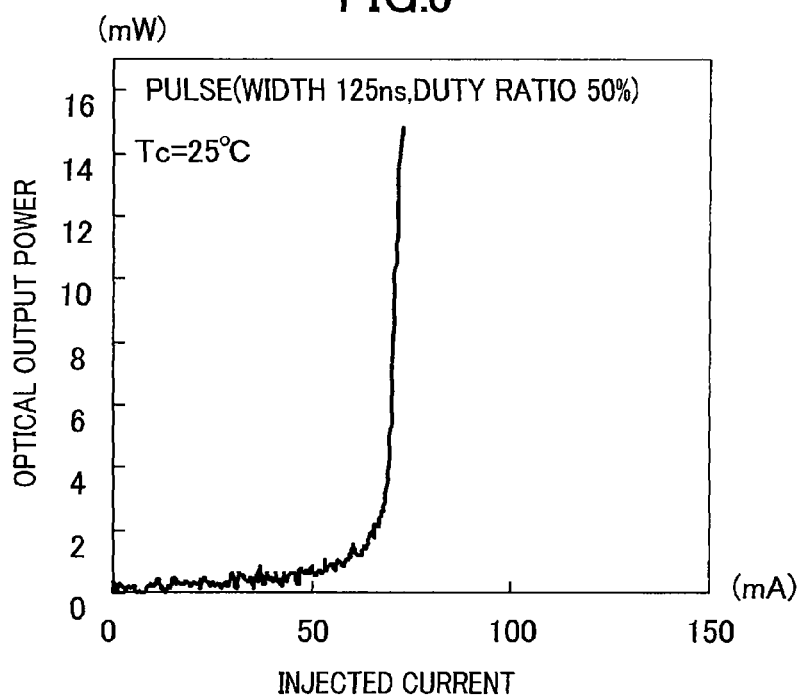
FIG. 6 is a graph showing the injected-current dependence of optical output power in the blue-violet semiconductor laser device according to the example embodiment.
Figure 7:
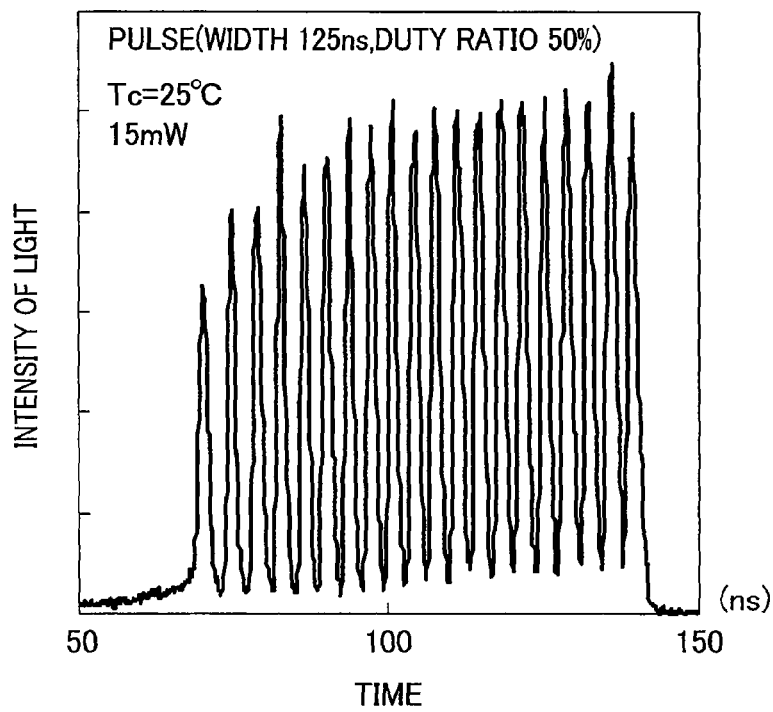
FIG. 7 is a graph showing the injected-current dependence of optical response in the blue-violet semiconductor laser device according to the example embodiment.

FIG. 6 shows optical output power characteristics with respect to an injected pulsed current in the blue-violet self-oscillation laser device according to this embodiment. FIG. 7 shows optical response characteristics with respect to an injected pulsed current in the same laser device. The injected currents had a pulse period of 125 ns, and a duty ratio of 50%. As shown in FIG. 6, the excellent laser oscillation characteristics are achieved. Also, as shown in FIG. 7, the laser device exhibits the pulsed optical response characteristics in the current injection areas, and when the injected pulsed-current is in the off state, the optical response stops, indicating that self-oscillation is performed.

Figure 8:
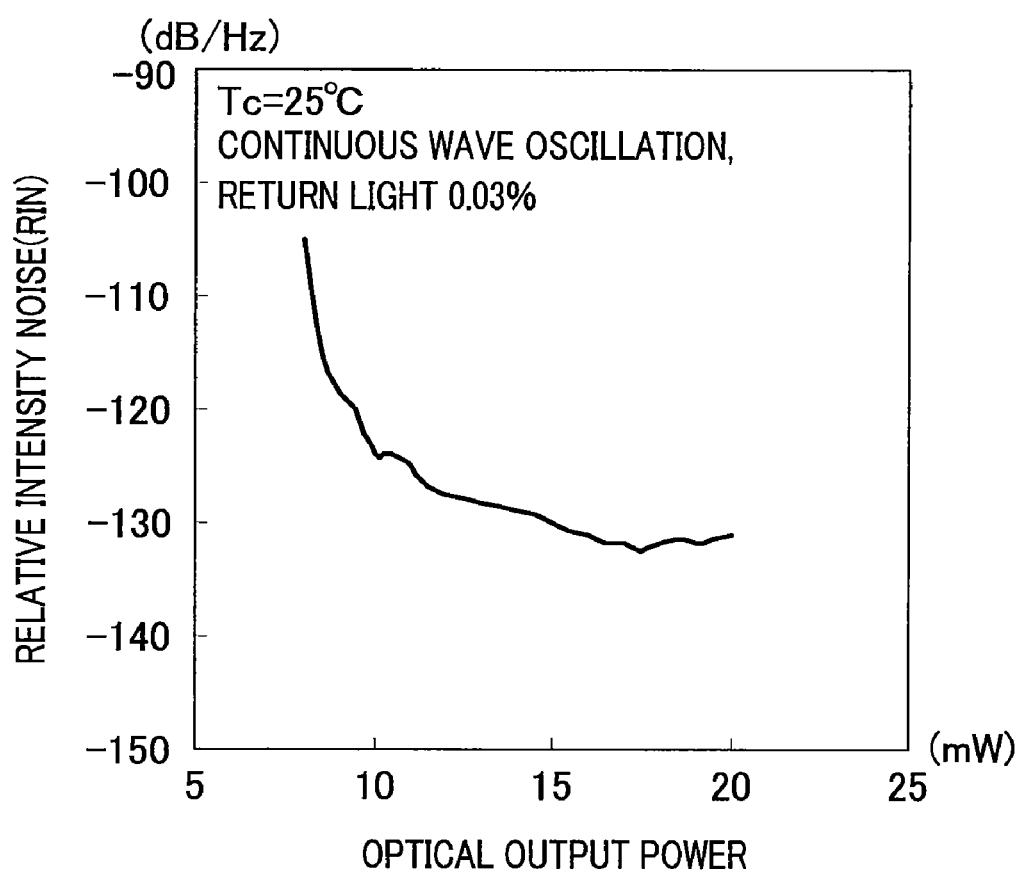
FIG. 8 is a graph showing the optical-output-power dependence of return light noise (RIN) in the blue-violet semiconductor laser device according to the example embodiment.

FIG. 8 shows the output-power dependence of return light noise characteristics (RIN characteristics) obtained when a CW (continuous wave) operation was performed in which a current was continuously injected into the blue-violet self-oscillation laser device of this embodiment. The return light noise characteristics are lower than −130 dB/Hz when the optical output power is in the vicinity of 15 mW, showing that noise is reduced significantly without providing a superposed circuit.

As described above, even if the quantum well structure (the MQW active layer 5) is employed in the waveguide, the semiconductor laser device according to this embodiment has such bandgap energy that enables light absorption, thereby allowing the formation of the region (the saturable absorption region 22) that increases light absorption. In addition, the saturable absorption region 22 can be controlled with a simple fabrication process. That is, just forming the groove 1a in the substrate 1 is sufficient to form, in the waveguide structure, the optical gain region 21 and the saturable absorption region 22 that have different bandgap energy simultaneously with the formation of the MQW active layer 5.

Accordingly, in this embodiment, the blue-violet semiconductor laser device that performs self-oscillation which reduces return light noise is realized through a simple process without an increase in fabrication costs.

A First Modified Example of the Example Embodiment

A semiconductor laser device according to a first modified example of the example embodiment will be described below with reference to the accompanying drawings.

Figure 9A:
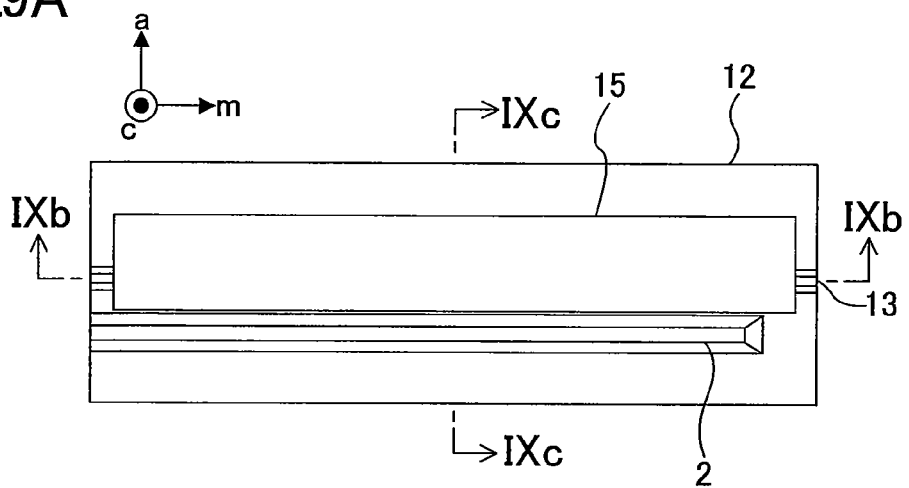
FIGS. 9A to 9C illustrate a blue-violet semiconductor laser device according to a first modified example of the example embodiment.
Figure 9B:
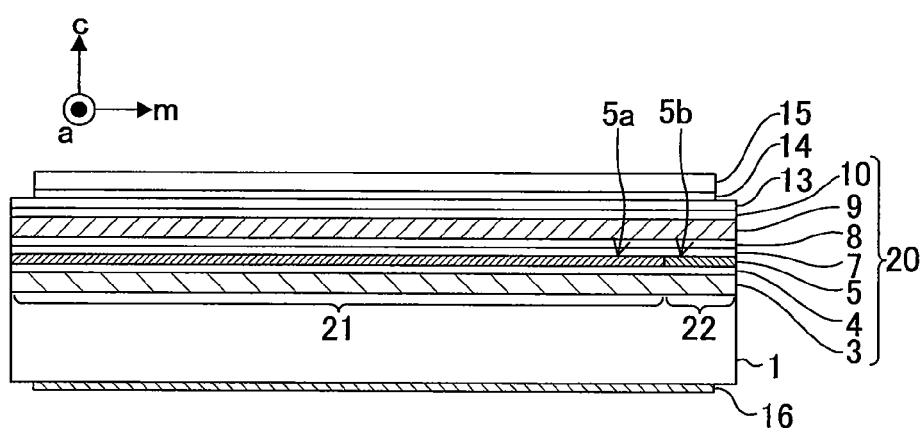
Figure 9C:
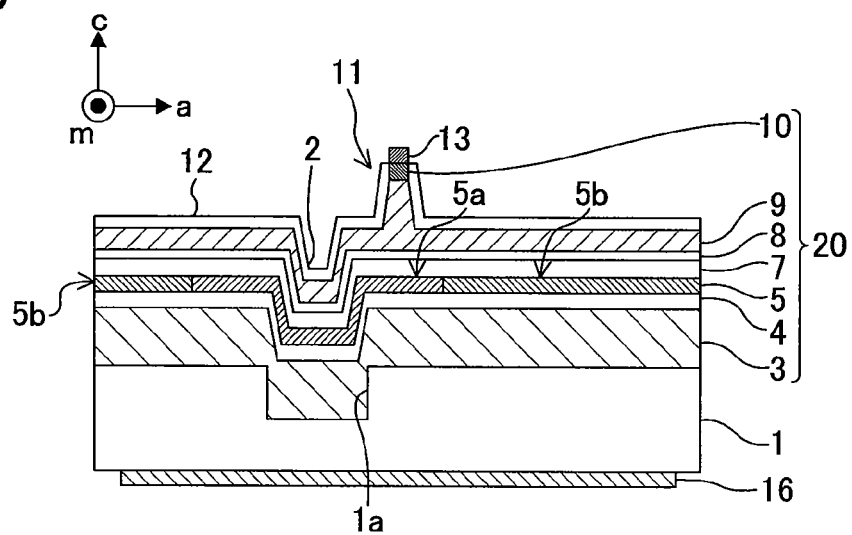

FIGS. 9A to 9C illustrate the blue-violet semiconductor laser device according to the first modified example of the example embodiment. FIG. 9A shows a planar structure, FIG. 9B shows a cross-sectional structure taken along the line IXb-IXb of FIG. 9A, and FIG. 9C shows a cross-sectional structure taken along the line IXc-IXc of FIG. 9A. In FIGS. 9A to 9C, the same members as those shown in FIGS. 1A to 1C are identified by the same reference numerals, and the description thereof will be thus omitted. The same holds true for the following other modified examples.

As shown in FIGS. 9A and 9B, in the semiconductor laser device according to the first modified example, the recess 2 in the upper portion of the multilayer structure 20 is formed so as to extend to the light emitting facet (the front facet).

As a result, the first region 5a, occurring due to the recess 2 and having high bandgap energy, is formed to reach the light emitting facet, and the optical gain region 21 is formed so as to include this first region 5a. The recess 2 according to the first modified example is formed by extending the groove 1a in the substrate 1 to the light emitting facet.

Extending the recess 2 to the light emitting facet causes self-oscillation, and thus there is no saturable absorption region in the vicinity of the light emitting facet. Hence, even if the intensity of light is increased at the light emitting facet, it is possible to prevent a reduction in COD level.

Second Modified Example of the Example Embodiment

A semiconductor laser device according to a second modified example of the example embodiment will be described below with reference to the accompanying drawings.

Figure 10A:
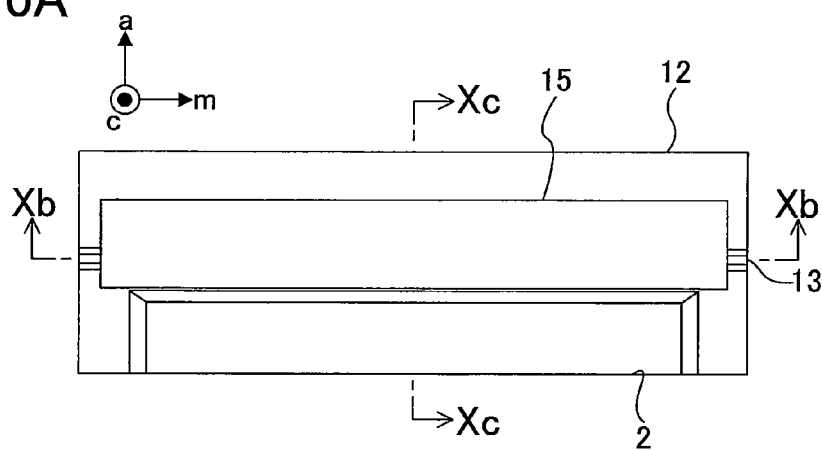
FIGS. 10A to 10C illustrate a blue-violet semiconductor laser device according to a second modified example of the example embodiment.
Figure 10B:
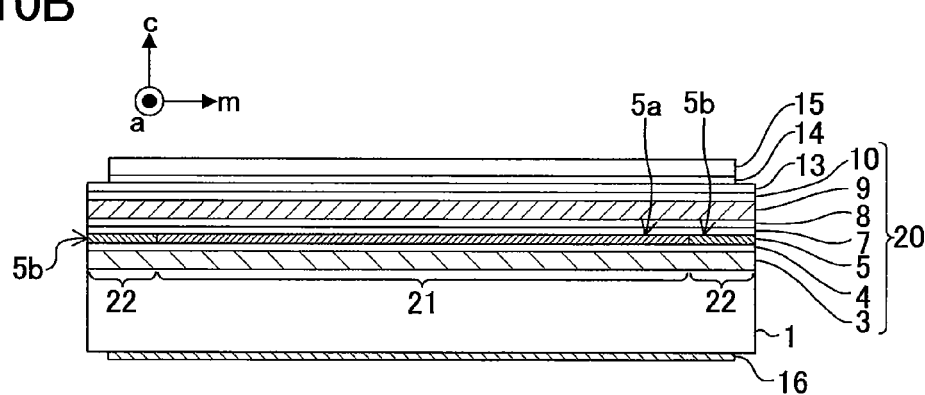
Figure 10C:
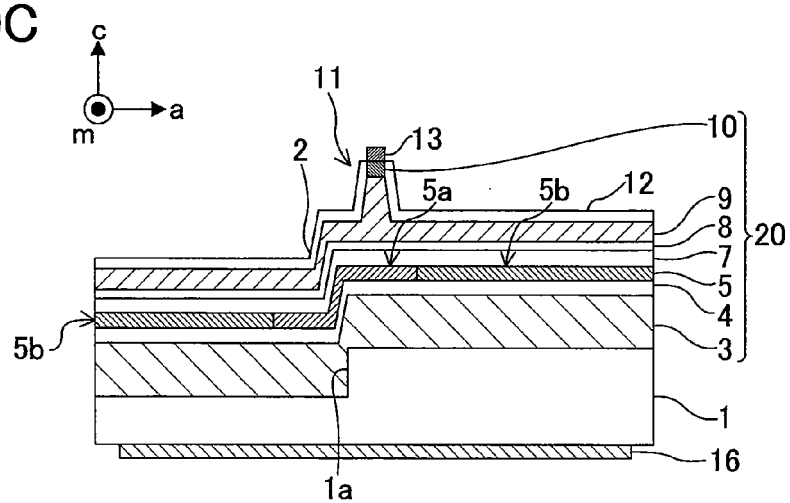

FIGS. 10A to 10C illustrate the blue-violet semiconductor laser device according to the second modified example of the example embodiment. FIG. 10A shows a planar structure, FIG. 10B shows a cross-sectional structure taken along the line Xb-Xb of FIG. 10A, and FIG. 10C shows a cross-sectional structure taken along the line Xc-Xc of FIG. 10A.

As shown in FIGS. 10A to 10C, in the semiconductor laser device according to the second modified example, the recess 2 in the upper portion of the multilayer structure 20 is formed so as to expand to the side of the multilayer structure 20 that is parallel with the m-axis direction.

The first region 5a, which occurs due to the step region in the recess 2 at the side of the ridge stripe portion 11 and which has high bandgap energy, is also formed in this case. Thus, the optical grain region 21 is formed so as to include this first region 5a. The recess 2 according to the second modified example is formed by expanding the groove 1a in the substrate 1 to the side of the substrate 1 that is parallel with the m-axis direction.

Third Modified Example of the Example Embodiment

A semiconductor laser device according to a third modified example of the example embodiment will be described below with reference to the accompanying drawings.

Figure 11A:
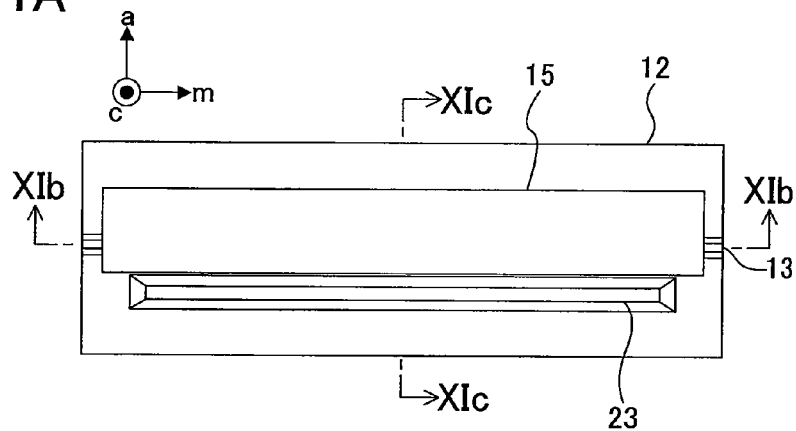
FIGS. 11A to 11C illustrate a blue-violet semiconductor laser device according to a third modified example of the example embodiment.
Figure 11B:
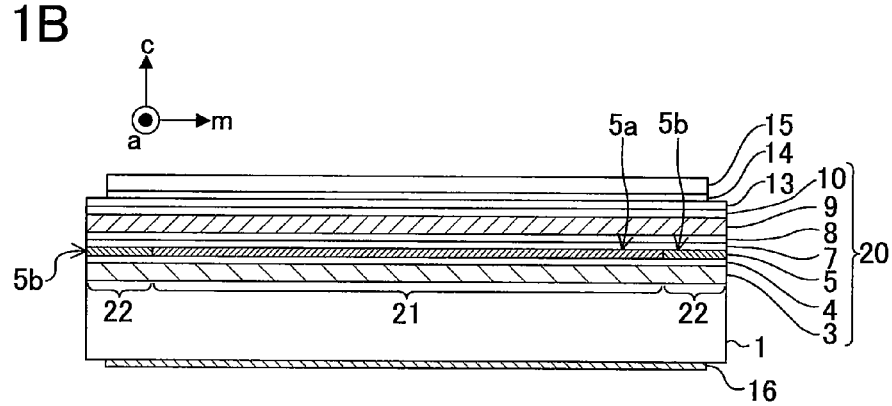
Figure 11C:
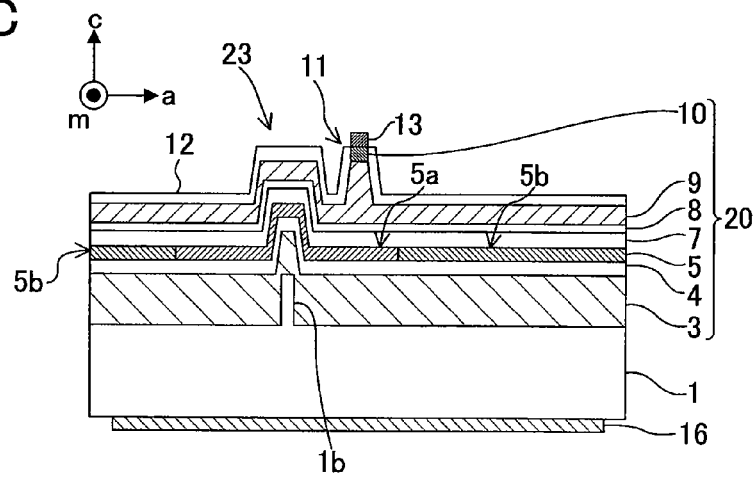
Figure 12:
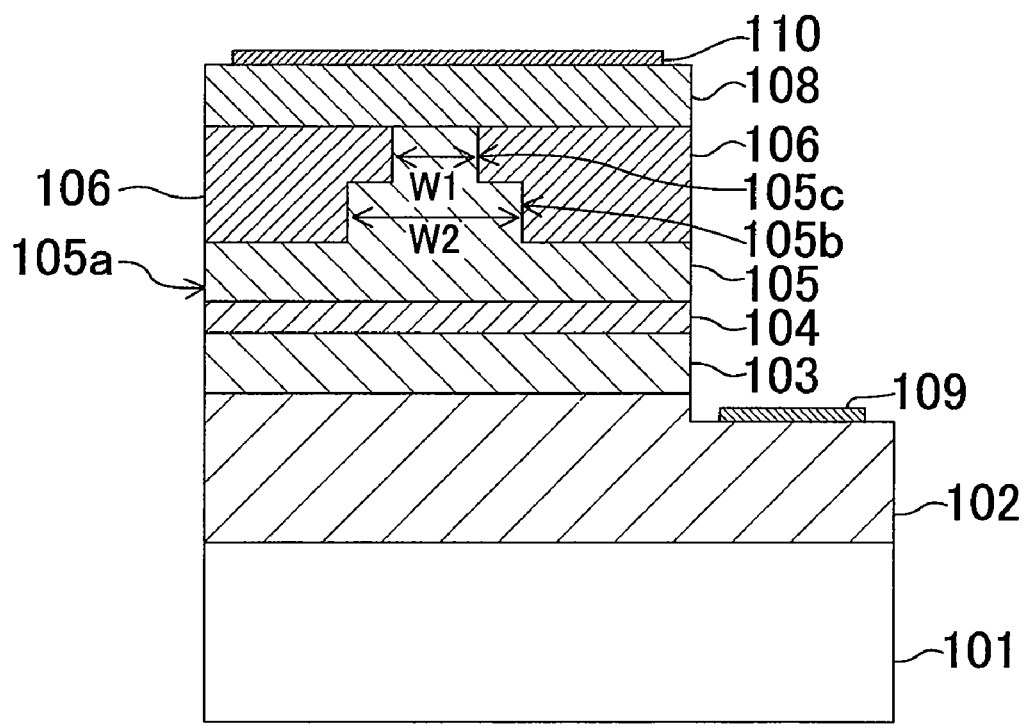
FIG. 12 is a cross-sectional view illustrating a conventional nitride semiconductor laser device.
Figure 13:
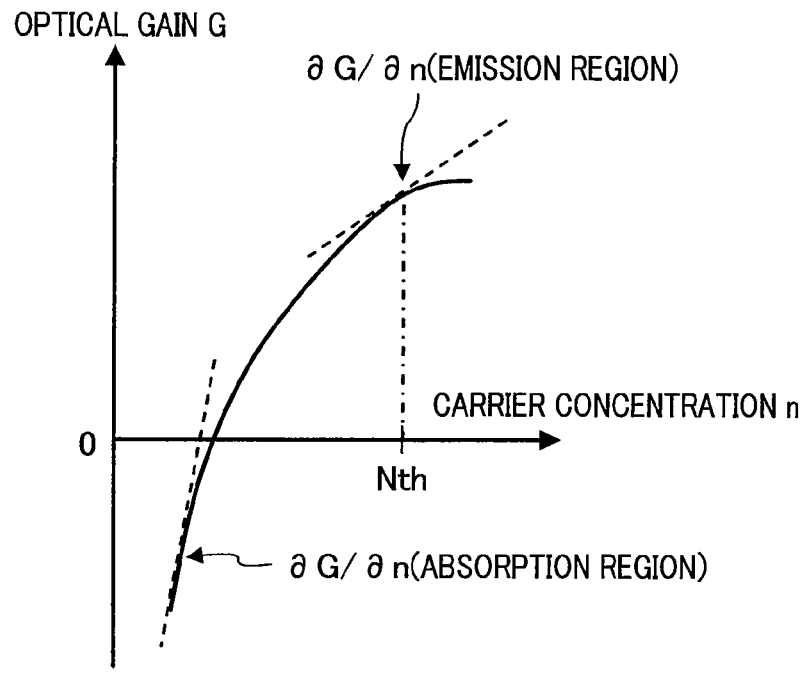
FIG. 13 is a graph for explaining the injected-carrier-density dependence of a typical optical gain.
Figure 14:
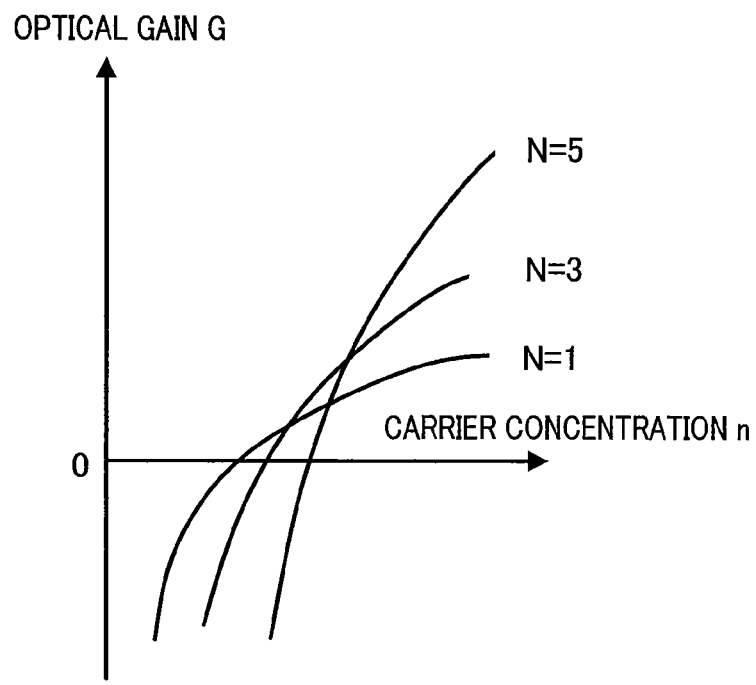
FIG. 14 is a graph for explaining the dependence of a typical optical gain function on the number of quantum wells.

FIGS. 11A to 11C illustrate the blue-violet semiconductor laser device according to the third modified example of the example embodiment. FIG. 11A shows a planar structure, FIG. 11B shows a cross-sectional structure taken along the line XIb-XIb of FIG. 11A, and FIG. 11C shows a cross-sectional structure taken along the line XIc-XIc of FIG. 11A.

As shown in FIGS. 11A and 11C, in the semiconductor laser device according to the third modified example, the step region in the multilayer structure 20 is formed by forming a projection 23 instead of the recess 2. The projection 23 is formed by forming a stripe-shaped protrusion 1b instead of forming the groove 1a in the principal surface of the substrate 1.

In this modified example, the length of the protrusion 1b on the substrate 1 in the m-axis direction may be set to about 50 μm or more and about 200 μm or less, for example. The width of the protrusion 1b in the a-axis direction is preferably about 2 μm or more and about 200 μm or less, and even more preferably, about 20 μm or more and about 100 μm or less, for example.

The height of the protrusion 1b is preferably about 0.1 μm or more and about 5 μm or less, for example. The height of the projection 23 formed in the multilayer structure 20 is preferably about 0.01 μm or more and about 5 μm or less, for example.

The ridge stripe portion 11 may be formed so as to be in parallel with the m-axis direction, and so as to be away from the edge of the step region in the a-axis direction by a distance of about 1 μm or more and about 15 μm or less, and even more preferably, by a distance of about 2 μm or more and about 10 μm or less. However, the length, width, and height of the protrusion 1 are not limited to the above-described values.

It is preferable that the recess 2 in the above-described embodiment and in the first and second modified examples thereof, and the projection 23 in the third modified example be formed in only one side of the ridge stripe portion 11 (the waveguide).

As described above, the semiconductor laser devices according to the present disclosure, which realize group III nitride semiconductor laser devices that perform stable self-oscillation, are applicable to light sources for optical discs, for example.

What is claimed is:

1. A semiconductor laser device comprising:
    a substrate; and
    a multilayer structure made of group III nitride semiconductors formed on the substrate, the multilayer structure including an active layer,
    wherein the multilayer structure includes
        a stripe-shaped waveguide extending in parallel to a principal surface of the multilayer structure,
        a step region selectively formed in an upper portion of the multilayer structure in the vicinity of the waveguide,
        a first region, which is formed in an area of the waveguide in the vicinity of the step region, and in which the active layer has a bandgap energy of Eg1, and
        a second region, which is formed in an area of the waveguide other than in the vicinity of the step region, and in which the active layer has a bandgap energy of Eg2 (Eg2≠Eg1);
    the first region and the second region are adjacent to each other; and
    the waveguide is formed in a region that does not include the step region, so as to perform self-oscillation.

2. The semiconductor laser device of claim 1, wherein a recess or a protrusion is formed in or on a principal surface of the substrate; and
    the step region is formed due to the recess in or the protrusion on the substrate.

3. The semiconductor laser device of claim 1, wherein the active layer contains indium (In).

4. The semiconductor laser device of claim 1, wherein an inclination angle at which the first region is inclined with respect to a crystal plane of the principal surface of the multilayer structure is different from an inclination angle at which the second region is inclined with respect to the crystal plane of the principal surface.

5. The semiconductor laser device of claim 1, wherein a principal surface of the substrate has a {0001} crystal plane orientation;
    the waveguide is formed in a <1-100> direction of a crystal axis; and
    at least a part of the step region is formed along the waveguide.

6. The semiconductor laser device of claim 5, wherein the length of the step region in the <1-100> direction of the crystal axis is set in such a manner that one of the first and second regions having higher bandgap energy has a greater length than the other having lower bandgap energy in the direction in which the waveguide extends.

* * * * *